United States Patent
Otani et al.

(10) Patent No.: US 10,361,363 B2
(45) Date of Patent: Jul. 23, 2019

(54) METHOD OF MANUFACTURING TUNNEL MAGNETORESISTIVE EFFECT ELEMENT AND SPUTTERING APPARATUS

(71) Applicant: CANON ANELVA CORPORATION, Kawasaki-shi (JP)

(72) Inventors: Yuichi Otani, Kawasaki (JP); Takuya Seino, Kawasaki (JP)

(73) Assignee: CANON ANELVA CORPORATION, Kawasaki-Shi (JP)

(*) Notice: Subject to any disclaimer, the term of this patent is extended or adjusted under 35 U.S.C. 154(b) by 411 days.

(21) Appl. No.: 15/168,898

(22) Filed: May 31, 2016

(65) Prior Publication Data
US 2016/0276583 A1    Sep. 22, 2016

Related U.S. Application Data

(63) Continuation of application No. PCT/JP2014/005729, filed on Nov. 14, 2014.

(30) Foreign Application Priority Data

Feb. 14, 2014  (JP) ................................. 2014-026132

(51) Int. Cl.
H01J 37/34    (2006.01)
H01L 43/12    (2006.01)
(Continued)

(52) U.S. Cl.
CPC ............ *H01L 43/12* (2013.01); *C23C 14/081* (2013.01); *C23C 14/225* (2013.01);
(Continued)

(58) Field of Classification Search
CPC . C23C 14/081; C23C 14/225; C23C 14/3407; C23C 14/352; H01J 37/3426;
(Continued)

(56) References Cited

U.S. PATENT DOCUMENTS 7,780,820 B2    8/2010 Zhao et al.
8,932,438 B2    1/2015 Tsunekawa et al.
(Continued)

FOREIGN PATENT DOCUMENTS

JP    2013-82961 A    5/2013
WO   2009/154009 A1   12/2009
WO   2011/122411 A1   10/2011

OTHER PUBLICATIONS

International Search Report issued in PCT/JP2014/005729, dated Feb. 3, 2015 (1 page).
(Continued)

*Primary Examiner* — Rodney G McDonald
(74) *Attorney, Agent, or Firm* — Venable LLP

(57) ABSTRACT

A method includes: a first film formation process forming a film by sputtering a first insulator target when a projection plane of the first insulator target on a plane including a front face of a substrate is in a first state; and a second film formation process forming a film by sputtering a second insulator target when a projection plane of the second insulator target formed on the plane including the front face of the substrate is in a second state different from the first state. The second film formation process provides the insulating film having a second characteristic variation having opposite tendency to a first characteristic variation in the film provided by the first film formation process, the first characteristic variation occurring from a center portion to a peripheral portion of the substrate, the second characteristic variation occurring at least partly from the center portion to the peripheral portion.

1 Claim, 8 Drawing Sheets

(51) Int. Cl.
*G01R 33/00* (2006.01)
*H01F 10/32* (2006.01)
*H01F 41/18* (2006.01)
*G01R 33/09* (2006.01)
*C23C 14/08* (2006.01)
*C23C 14/22* (2006.01)
*C23C 14/35* (2006.01)
*C23C 14/34* (2006.01)
*G11C 11/16* (2006.01)
*H01F 10/12* (2006.01)
*H01L 43/02* (2006.01)
*H01L 43/08* (2006.01)
*H01L 43/10* (2006.01)

(52) U.S. Cl.
CPC ........ *C23C 14/3407* (2013.01); *C23C 14/352* (2013.01); *G01R 33/00* (2013.01); *G01R 33/0052* (2013.01); *G01R 33/098* (2013.01); *G11C 11/161* (2013.01); *H01F 10/123* (2013.01); *H01F 10/32* (2013.01); *H01F 41/18* (2013.01); *H01J 37/3426* (2013.01); *H01J 37/3435* (2013.01); *H01J 37/3476* (2013.01); *H01L 43/02* (2013.01); *H01L 43/08* (2013.01); *H01L 43/10* (2013.01)

(58) Field of Classification Search
CPC .............. H01J 37/3435; H01J 37/3476; G01R 33/0052; G01R 33/0098; G11C 11/161; H01F 10/123; H01F 41/307; H01F 10/3236; H01F 10/3272; H01L 43/02; H01L 43/08; H01L 43/10; H01L 43/12
USPC .......................... 204/192.2, 192.13, 298.03
See application file for complete search history.

(56) References Cited

U.S. PATENT DOCUMENTS

| | | |
|---|---|---|
| 8,974,648 B2 | 3/2015 | Otani et al. |
| 2013/0048494 A1 | 2/2013 | Kikuchi et al. |
| 2014/0158524 A1 | 6/2014 | Otani et al. |

OTHER PUBLICATIONS

Worledge, D.C., et al., "Spin torque switching of perpendicular Ta/CoFeB/MgO-based magnetic tunnel junctions", Applied Physics Letters 98, pp. 022501-1-022501-3 (2011).

Choi, Young-suk, et al., "Novel Stack Structure of Magnetic Tunnel Junction with MgO Tunnel Barrier Prepared by Oxidation Methods: Preferred Grain Growth Promotion Seed Layers and Bi-layered Pinned Layer", Japanese Journal of Applied Physics 48, pp. 120214-1-120214-3 (2009).

METHOD OF MANUFACTURING TUNNEL MAGNETORESISTIVE EFFECT ELEMENT AND SPUTTERING APPARATUS

CROSS-REFERENCES TO RELATED APPLICATIONS

This application is a continuation application of International Application No. PCT/JP2014/005729, filed Nov. 14, 2014, which claims the benefit of Japanese Patent Application No. 2014-026132 filed Feb. 14, 2014. The contents of the aforementioned applications are incorporated herein by reference in their entireties.

TECHNICAL FIELD

The present invention relates to a method of manufacturing a tunnel magnetoresistive effect element and to a sputtering apparatus.

BACKGROUND ART

A magnetoresistive random access memory (MRAM) which is an integrated magnetic memory utilizing a tunnel magnetoresistive effect (TMR) technology has been recently attracting attention. TMR elements used in the MRAM include an in-plane magnetization type element described in Non Patent Document 1 and a perpendicular magnetization type element described in Non Patent Document 2. In the in-plane magnetization type, the magnetization directions of a free layer and a reference layer form magnetic rotation in a direction perpendicular to a stacking direction of stacked layers forming the element. In the perpendicular magnetization type, the magnetization directions of the free layer and the reference layer form magnetic rotation in the same direction as the stacking direction of the stacked layers forming the element.

In manufacturing of the TMR elements, there is widely used a sputtering method (hereafter, also simply referred to as sputter) of sputtering a target made of a desired film formation material to form a film on a substrate opposed to the target. As a method of forming an insulating film used as a tunnel barrier layer in a TMR element, there is known a method of performing RF sputtering of an oxide target to form an oxide film (see Patent Document 1). Moreover, a method of forming an oxide film by forming a metal film, followed by oxidation treatment (see Patent Document 2) is also known.

CITATION LIST

Patent Document

Patent Document 1: Japanese Patent Application Laid-Open No. 2013-82961
Patent Document 2: Specification of U.S. Pat. No. 7,780,820

Non Patent Document

Non Patent Document 1: Young-suk Choi et al., Jpn. J. of Appl. Phys. 48, 120214 (2009)
Non Patent Document 2: D. C. Worledge et al., Appl. Phys. Lett. 98, 022501 (2011)

SUMMARY OF INVENTION

In order to obtain a signal with higher output in a device using a TMR element, a TMR element having a higher magnetoresistive ratio (MR ratio) needs to be manufactured. Particularly, the state of the tunnel barrier layer greatly affects the MR ratio.

A MR ratio in the case of the oxide film formed by using an oxide target as described in Patent Document 1 tends to be higher than that in the case of the oxide film formed by oxidizing the metal layer as described in Patent Document 2. However, an electric resistance value in the case of the oxide film formed by the film formation process using the method described in Patent Document 1 tends to vary among various points within the plane of the substrate, particularly from the center to an outer periphery of the substrate, more greatly than that in the case of the oxide film formed by using the method described in Patent Document 2. Such variation in electric resistance value leads to variation in characteristic among magnetoresistive effect elements obtained from one substrate and reduces the yield. Accordingly, it is desirable to reduce such variation as much as possible.

The present invention has been made to solve the problems described above, and an object thereof is to provide a method of manufacturing a tunnel magnetoresistive effect element and a sputtering apparatus which can reduce variation in characteristic such as an electric resistance value within the plane of a substrate when film formation processing is performed on the substrate by a sputtering method using an insulator target.

For solving the problems described above, a method of manufacturing a tunnel magnetoresistive effect element according to a first aspect of the present invention is a method of manufacturing a tunnel magnetoresistive effect element in which a tunnel barrier layer is disposed between two ferromagnetic layers, including: a first film formation process of forming an insulating film on a front face of a substrate on which one of the ferromagnetic layers is formed, by sputtering a first insulator target when a projection plane of the first insulator target formed on a plane including the front face of the substrate is in a first state; and a second film formation process of forming an insulating film on the front face of the substrate, by sputtering a second insulator target when a projection plane of the second insulator target formed on the plane including the front face of the substrate is in a second state different from the first state, wherein the sputtering in the second film formation process provides the insulating film having a second characteristic variation having opposite tendency to a first characteristic variation in the insulating film provided by the sputtering in the first film formation process, the first characteristic variation occurring from a center portion to a peripheral portion of the substrate, the second characteristic variation occurring at least partly from the center portion to the peripheral portion of the substrate.

A sputtering apparatus according to a second aspect of the present invention includes: a processing chamber; an exhaust unit which exhausts gas inside the processing chamber; a substrate holder which is disposed inside the processing chamber and which holds a substrate; a target holder which is disposed inside the processing chamber and to which an insulator target is attachable; a high-frequency power supply which applies high-frequency power to the target holder to form plasma near the target holder; and a control unit which: performs a first film formation process on the substrate held by the substrate holder by setting a relationship between relative positions of the target holder and the substrate holder to a first relationship and sputtering the insulator target attached to the target holder by causing the high-frequency power supply to apply the high-frequency power to the target holder; and then performs a second film formation process on the substrate by setting the relationship between the relative positions of the target holder and the substrate holder to a second relationship different from the first relationship and sputtering the insulator target attached to the target holder by causing the high-frequency power supply to apply the high-frequency power to the target holder, the second relationship providing an insulating film having a second characteristic variation having opposite tendency to a first characteristic variation in the insulating film provided by the first film formation process using the first relationship, the first characteristic variation occurring from a center portion to a peripheral portion of the substrate, the second characteristic variation occurring at least partly from the center portion to the peripheral portion.

The present invention can reduce variation in characteristic such as an electrical resistance value in a plane of a substrate when film formation processing is performed on the substrate by a sputtering method using an insulator target.

DESCRIPTION OF EMBODIMENTS

Figure 1:
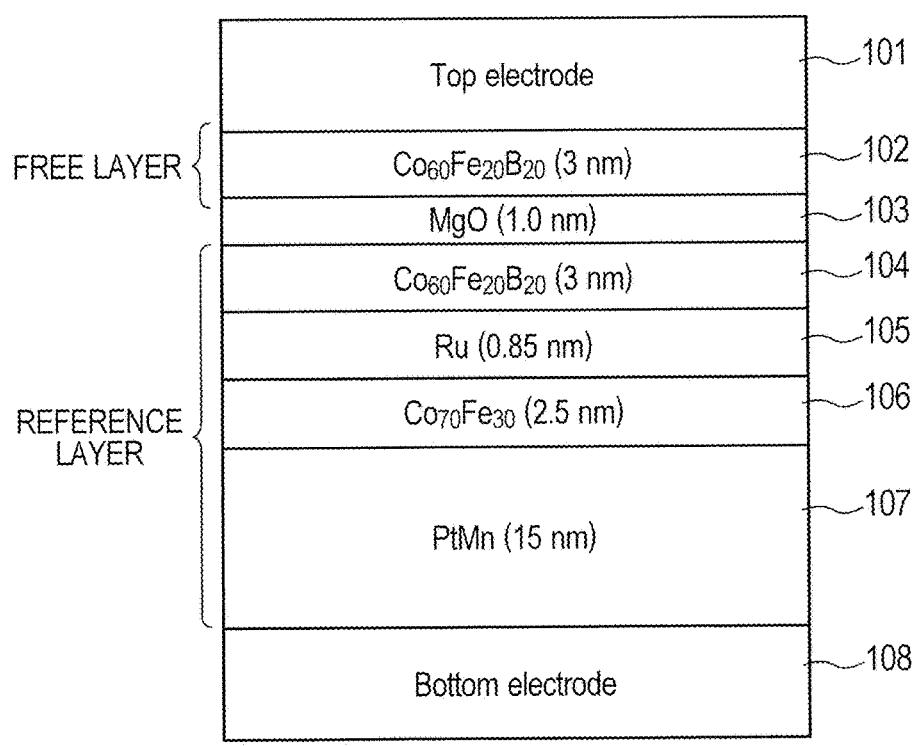
FIG. 1 is a schematic view illustrating a stacked structure of a tunnel magnetoresistive effect element of an in-plane magnetization type.

Although an embodiment of the present invention is described below with reference to the drawings, the present invention is not limited to the embodiment described below. Note that, in the drawings described below, parts having the same function are denoted by the same reference numeral and overlapping description thereof is omitted in some cases.

(Description of Structure of Tunnel Magnetoresistive Effect Element (TMR Element)

An example of a structure of a TMR element is described below. The TMR element described below can be manufactured by a method of manufacturing a TMR element according to one embodiment of the present invention.

FIG. 1 is a schematic view illustrating a stacked structure of a TMR element of an in-plane magnetization type (hereafter, also simply referred to as TMR element) described in Non Patent Document 1.

As illustrated in FIG. 1, in the TMR element 100, a metal layer or a metal compound layer containing, for example, Ta and Cu are stacked on a processing substrate as a bottom electrode layer 108. Specifically, the bottom electrode layer 108 has a structure of, for example, Ta (5 nm)/CuN (20 nm)/Ta (5 nm). Note that, in this description, a stacked structure formed by stacking layers of materials is expressed in such a way that the names of the materials or the names of the materials followed by thickness thereof in parentheses are sectioned by "/" and the layer on the right of "/" is located above the layer on the left of "/" in the stacked structure. In the bottom electrode layer 108, Ta in an upper portion also has a role of an underlying layer, and a metal other than Ta such as Hf, Nb, Zr, Ti, Mo, or W can be used. Moreover, a layer containing at least one of elements of Ni, Fe, Cr, and Ru may be formed on Ta.

An antiferromagnetic layer 107 made of, for example, IrMn, PtMn, FeMn, NiMn, RuRhMn, CrPtMn, or the like and having a thickness of, for example, about 3 to 20 nm is formed on the bottom electrode layer 108. A reference layer 106 formed of, for example, a ferromagnetic layer of CoFe or the like and having a thickness of, for example, about 1 to 5 nm is formed on the antiferromagnetic layer 107. A non-magnetic intermediate layer 105 made of at least one of metals selected from, for example, Ru, Cr, Rh, Ir, and Re or an alloy of two or more metals described above and having a thickness of, for example, about 0.85 nm is formed on the reference layer 106. A reference layer 104 formed of a ferromagnetic layer of, for example, CoFe, CoFeB, or the like and having a thickness of, for example, about 1 to 5 nm is formed on the non-magnetic intermediate layer 105.

The antiferromagnetic layer 107, the reference layer 106, the non-magnetic intermediate layer 105, and the reference layer 104 which are described above form a synthetic reference layer. The synthetic reference layer may be configured to have a two-layer structure of the antiferromagnetic layer 107 and the reference layer 106. The synthetic reference layer is a layer in which a direction of magnetization is fixed.

A tunnel barrier layer 103 is formed on the reference layer 104. In order to obtain a high MR ratio, magnesium oxide (MgO) is preferable as the material of the tunnel barrier layer 103. As an alternative, the material of the tunnel barrier layer 103 may be an oxide of at least one or two or more of Mg, Al, Ti, Zn, Hf, Ge, and Si.

A free layer 102 having a structure formed by stacking one or two or more layers of a material and having a thickness of, for example, 1 to 10 nm is formed on the tunnel barrier layer 103, the material being, for example, CoFeB or an alloy of at least one or two or more of Co, Fe, Ni, and the like. The free layer 102 is a ferromagnetic layer in which magnetization is not fixed, and the resistance thereof changes depending on an angle relative to the magnetization of the reference layer.

A layer having a stacked structure such as, for example, Ta (8 nm)/Ru (5 nm)/Cu (30 nm)/Ru (7 nm) is formed on the free layer 102 as a top electrode layer 101. The top electrode layer 101 also has a function of protecting the element, and a portion of Ta may be replaced by a material such as, for example, Ru, Ti, or Pt.

The TMR element as illustrated in FIG. 1 described above can be fabricated consistently in vacuum by a cluster substrate processing apparatus.

Note that, in FIG. 1, the antiferromagnetic layer 107 is a PtMn layer having a thickness of 15 nm, the reference layer 106 is a $Co_{70}Fe_{30}$ (numeric values represent atomic %, the same applies hereafter) layer having a thickness of 2.5 nm, the non-magnetic intermediate layer 105 is a Ru layer having a thickness of 0.85 nm, the reference layer 104 is a $Co_{60}Fe_{20}B_{20}$ layer having a thickness of 3 nm, and the tunnel barrier layer 103 is a MgO layer having a thickness of 1.0 nm, and the free layer 102 is a $Co_{60}Fe_{20}B_{20}$ layer having a thickness of 3 nm.

Figure 2:
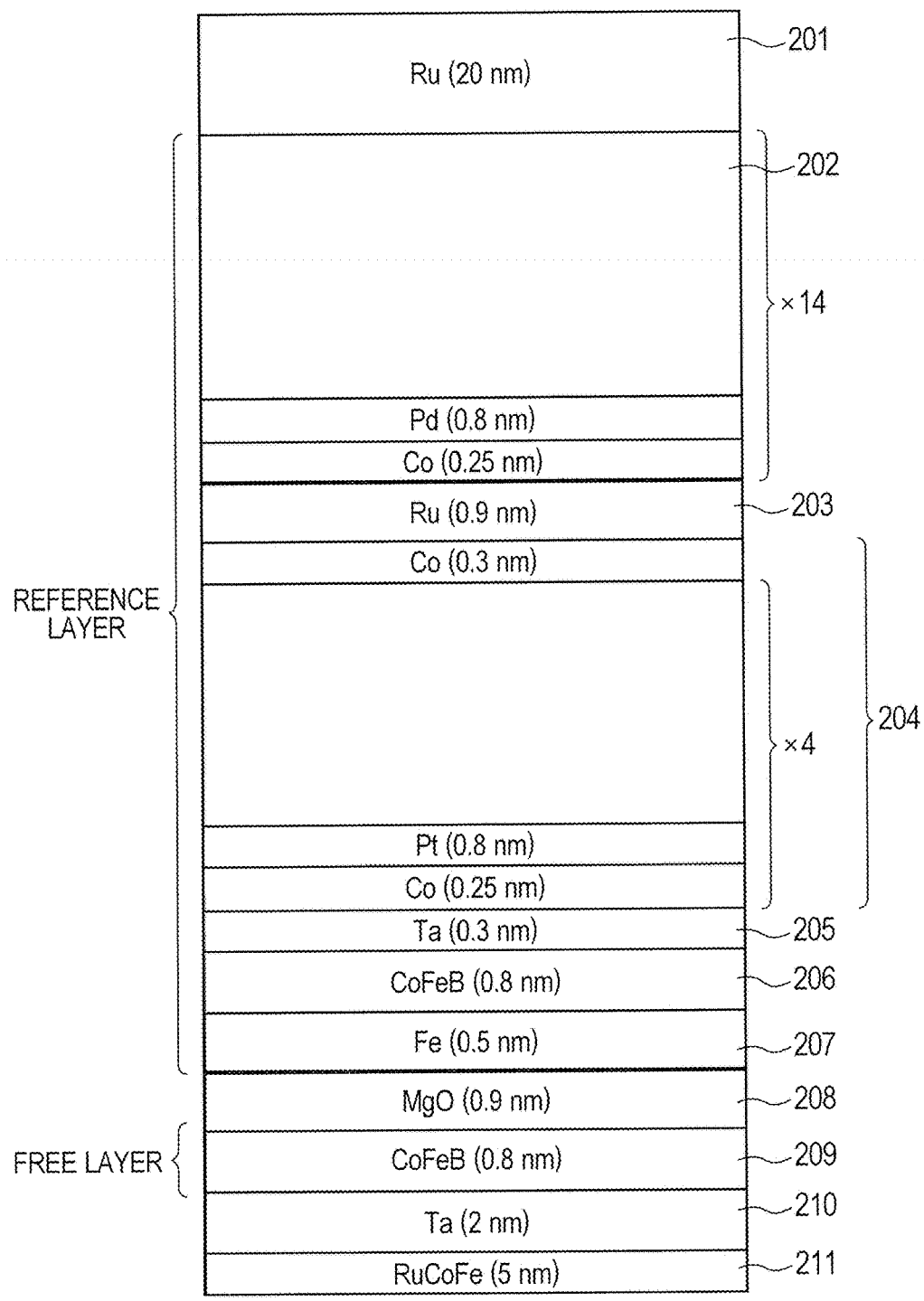
FIG. 2 is a schematic view illustrating a stacked structure of a tunnel magnetoresistive effect element of a perpendicular magnetization type.

FIG. 2 is a schematic view illustrating a stacked structure of a TMR element of a perpendicular magnetization type (hereafter, referred to as p-TMR element) described in Non Patent Document 2.

As illustrated in FIG. 2, in the p-TMR element 200, buffer layers 211, 210 are first sequentially formed on a processing substrate. For example, a material containing at least one of elements of Ni, Fe, Cr, and Ru is used for the buffer layer 211. Moreover, the buffer layer 210 is preferably made of a metal such as Ta, Hf, Nb, Zr, Ti, Mo, or W. Alternatively, the buffer layer 210 may be made of an oxide containing at least one or two or more of Mg, Al, Ta, Ti, Zn, Hf, Ge, and Si.

A free layer 209 formed of a ferromagnetic layer of, for example, CoFeB or the like is formed on the buffer layer 211. Furthermore, an alloy layer of at least one or two or more of Co and Fe may be disposed between this CoFeB layer and a MgO layer of a tunnel barrier layer 208 to be described later. The thickness of the CoFeB or CoFeB/CoFe magnetic layer is, for example, about 0.8 to 2.0 nm in total.

The tunnel barrier layer 208 is formed on the free layer 209. In order to obtain a high MR ratio, MgO is preferable also as the material of the tunnel barrier layer 208. The material of the tunnel barrier layer 208 may alternatively be an oxide containing at least one or two or more of Mg, Al, Ti, Zn, Hf, Ge, and Si.

A reference layer 207 formed of a ferromagnetic layer of, for example, Fe, CoFe, or the like and having a thickness of, for example, about 0.2 to 1 nm is formed on the tunnel barrier layer 208. A reference layer 206 formed of a ferromagnetic layer of, for example, CoFeB or the like and having a thickness of, for example, about 0.5 to 2.0 nm is formed on the reference layer 207. An orientation isolation layer 205 made of, for example, Ta or the like is formed on the reference layer 206. A reference layer 204 giving perpendicular magnetization anisotropy to the reference layer 206 and the reference layer 207 is formed on the orientation isolation layer 205.

FIG. 2 illustrates as an example of the reference layer 204 having a stacked structure in which Co/Pt is repeatedly stacked and Co is formed in the top layer. Moreover, the reference layer 204 may be in any of the forms of: stacked structures such as Co/Pd, Co/Pt, and Co/Ni; amorphous materials such as TbTeCo and GdFeCo; and ordered alloys such as FePt, CoPt, MnGa, and MnAl. Co/Pd, Co/Pt, or Co/Ni may be repeatedly stacked, and the number of times the stacking is repeated is not limited to a particular number.

Meanwhile, the element 200 may be configured such that the reference layer 207 is omitted and CoFeB of the reference layer 206 is in direct contact with the tunnel barrier layer 208. Moreover, the orientation isolation layer 205 may be made of, instead of Ta, an alloy of at least one or two or more of Ta, Hf, Nb, Zr, Ti, Mo, W, Pt, and Ru or an oxide containing at least one or two or more of Mg, Al, Ta, Ti, Zn, Hf, Ge, and Si.

A non-magnetic intermediate layer 203 made of an alloy of at least one or two or more of, for example, Ru, Cr, Rh, Ir, and Re and having a thickness of, for example, about 0.8 nm is formed on the reference layer 204. A reference layer 202 is formed on the non-magnetic intermediate layer 203.

FIG. 2 illustrates an example of the reference layer 202 having a stacked structure in which Co/Pd is repeatedly stacked. Moreover, the reference layer 202 may be in any of the forms of: stacked structures such as Co/Pd, Co/Pt, and Co/Ni; amorphous materials such as TbTeCo and GdFeCo; and ordered alloys such as FePt, CoPt, MnGa, and MnAl. Co/Pd, Co/Pt, or Co/Ni may be repeatedly stacked. Co/Pd, Co/Pt, or Co/Ni may be repeatedly stacked, and the number of times the stacking is repeated is not limited to a particular number.

The reference layer 207, the reference layer 206, the orientation isolation layer 205, the stacked structure portion of the reference layer 204, the non-magnetic intermediate layer 203, and the reference layer 202 which are described above form a synthetic reference layer. The synthetic reference layer may have a structure in which the non-magnetic intermediate layer 203 and the reference layer 202 are omitted and which is formed of the reference layer 207, the reference layer 206, the orientation isolation layer 205, and the reference layer 204.

A cap layer 201 made of, for example, Ta and having a thickness of, for example, 5 nm is formed on the reference layer 202. Ta may be replaced by a material such as, for example, Ru, Ti, and Pt.

The TMR element as illustrated in FIG. 2 described above can be also manufactured consistently in vacuum by a cluster substrate processing apparatus.

Note that, in FIG. 2, the buffer layer 211 is a RuCoFe layer having a thickness of 5 nm, the buffer layer 210 is a Ta layer having thickness of 2 nm, the free layer 209 is a CoFeB layer having a thickness of 0.8 nm, the tunnel barrier layer 208 is a MgO layer having a thickness of 0.9 nm, the reference layer 207 is a Fe layer of 0.5 nm, the reference layer 206 is a CoFeB layer having a thickness of 0.8 nm, the orientation isolation layer 205 is a Ta layer having a thickness of 0.3 nm, the reference layer 204 is a stacked structure in which a stacked body of a Co layer having a thickness of 0.25 nm and a Pt layer having a thickness of 0.8 nm is repeatedly stacked four times and a Co layer having a thickness of 0.3 nm is formed in the top layer, the non-magnetic intermediate layer 203 is a Ru layer having a thickness of 0.9 mm, the reference layer 202 is a structure in which a stacked body of a Co layer having a thickness of 0.25 nm and a Pt layer having a thickness of 0.8 nm are repeatedly stacked 14 times, and the cap layer 201 is a Ru layer having a thickness of 20 nm.

(Description of Sputtering Apparatus)

A configuration of a sputtering apparatus (hereafter also referred to as "film formation apparatus") according to the embodiment is described with reference to FIG. 3. The sputtering apparatus according to the embodiment is an RF sputtering apparatus and can form an oxide film such as a magnesium oxide film used as the tunnel barrier layer in the TMR elements illustrated in FIGS. 1 and 2 described above and also form other insulating films.

Figure 3:
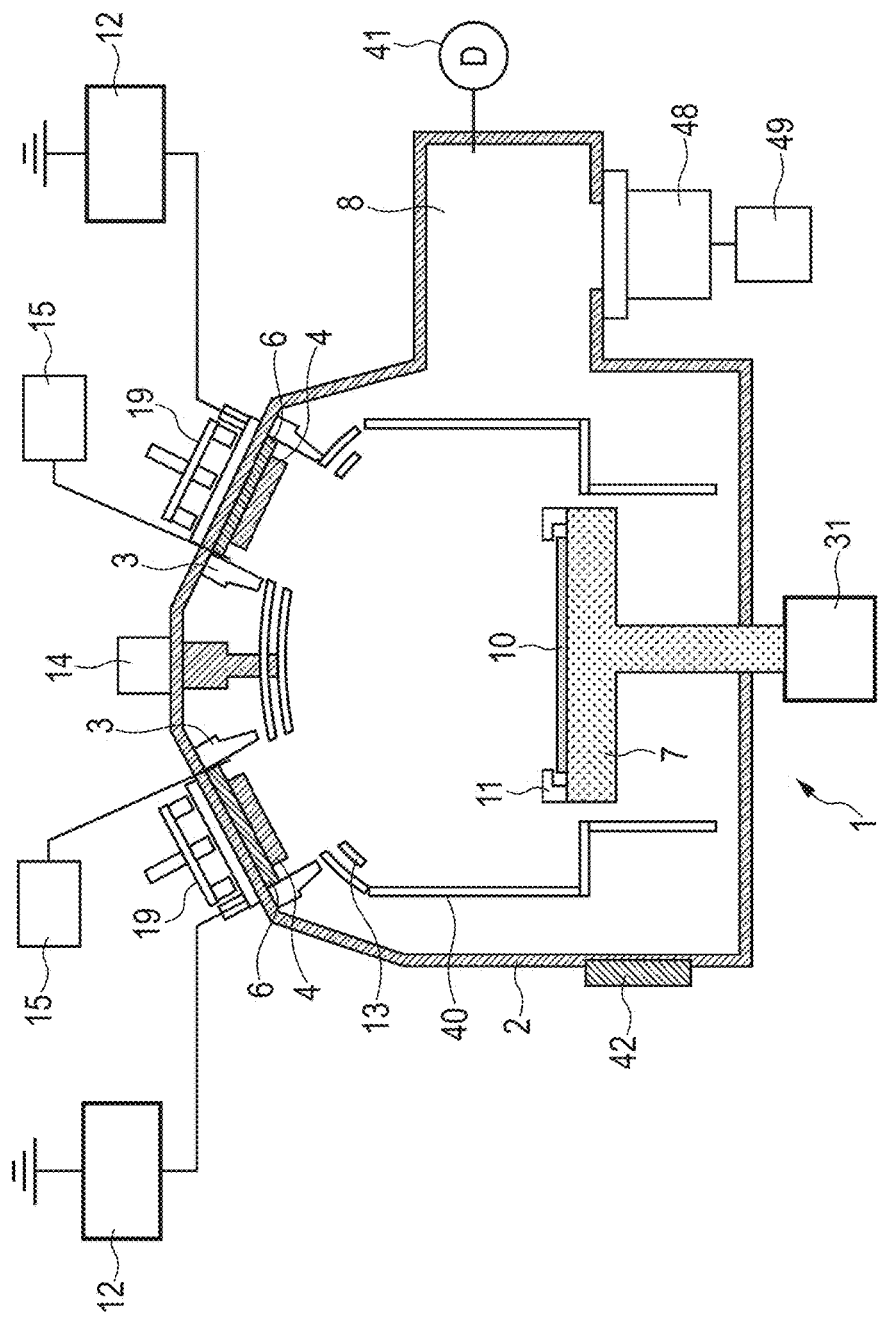
FIG. 3 is a view illustrating a schematic configuration of a sputtering apparatus according to one embodiment of the present invention.

As illustrated in FIG. 3, the film formation apparatus 1 includes a vacuum chamber 2 as a processing chamber. A turbomolecular pump 48 and a dry pump 49 which are exhaust units for exhausting gas inside the vacuum chamber 2 are connected to the vacuum chamber 2 via an exhaust port 8. Moreover, the film formation apparatus 1 includes a gas introduction mechanism 15 capable of introducing gas for electrical discharge into the vacuum chamber 2.

Inside the vacuum chamber 2, insulator targets 4 in which surfaces to be sputtered are exposed are held by target holders 6 in an upper portion of the vacuum chamber 2. The insulator targets 4 are made of an insulating material constituting an insulating film to be formed, and can be selected as appropriate depending on the type of the insulating film to be formed. For example, an oxide target can be used in the case of forming an oxide film. Particularly, when a magnesium oxide film is to be formed, magnesium oxide targets can be used as the insulator targets 4.

Note that, although FIG. 3 illustrates a case where the number of the insulator targets 4 is two, the number of the insulator targets 4 may be three or more.

Moreover, a substrate holder 7 for placing a substrate 10 having a front face on which the insulating film is to be formed is provided at a predetermined position where sputtered particles ejected from the targets 4 reach. The substrate 10 is loaded and unloaded via a gate valve 42 provided in the vacuum chamber 2. A mask 11 for preventing adhesion of the film onto end portions, side walls, and a back face of the substrate 10 may be provided around a substrate placing surface of the substrate holder 7. The substrate holder 7 is configured such that the substrate placing surface on which the substrate 10 is placed is rotatable, and is configured to be capable of rotating the substrate 10 in its plane with the substrate 10 placed on the substrate holder 7. In the embodiment, the rotating axis of the substrate holder 7 and the rotating axis of the substrate 10 are configured to be aligned with each other. Rotation of the substrate holder 7 is controlled by a substrate holder drive mechanism 31.

In addition, the vacuum chamber 2 is provided with a pressure gage 41 for measuring the pressure inside the vacuum chamber 2. Moreover, a tubular shield 40 (adhesion preventing shield member) is provided inside the vacuum chamber 2 to surround a space above the substrate holder 7.

The insulator targets 4 are disposed diagonally opposite to the substrate 10 and are opposed to the substrate 10 to be inclined with respect thereto. In the embodiment, insulator targets 4 having a diameter smaller than the diameter of the substrate 10 are used. By providing the insulator targets 4 at positions diagonally opposite to the substrate holder 7 and the substrate 10 as described in the embodiment, the insulating film formed on the substrate 10 can have excellent film thickness distribution in the plane of the substrate 10, even when the insulator targets 4 with a small diameter are used.

Note that the insulator targets 4 being inclined with respect to the substrate holder 7 and the substrate 10 means that, as illustrated in FIG. 3, in a situation where the unused insulator targets 4 with flat front surfaces are used, the front faces of the insulator targets 4 are not parallel to the front face of the substrate 10.

A high-frequency power supply (hereafter, also referred to as RF power supply) 12 is connected to each of the target holders 6. A not-illustrated matching device is provided between the RF power supply 12 and the target holder 6. The sputtering is performed by causing the RF power supply 12 to apply voltage to the target holder 6 and thereby forming plasma in a space inside the vacuum chamber 2. Magnetron units 19 are disposed on back surfaces of the target holders 6. The magnetron units 19 form lines of magnetic force to confine plasma near the targets 4.

Cylindrical adhesion prevention members 3 are installed near the target holders 6 to surround the target holders 6, and prevent sputtered particles from directly adhering to an inner surface of the vacuum chamber 2. Moreover, a shutter 13 is provided between the substrate holder 7 and each of the target holders 6. The shutter 13 is controlled by a shutter drive mechanism 14. The shutter 13 is thereby configured to be switchable between an opened state where the insulator target 4 and the substrate 10 are diagonally opposed to each other in an inclined manner and a closed state where the insulator target 4 and the substrate 10 are shielded from each other.

In the sputtering apparatus 1, two or more insulator targets 4 such as MgO targets can be provided. Providing two or more insulator targets 4 can increase a film formation speed and improve productivity compared to the case where electrical discharge is performed by using one insulator target 4.

The gas introduction mechanism 15 includes a pipe for introducing the gas for electrical discharge, a gas cylinder for storing the gas, a mass-flow controller for controlling a flow rate of the gas, valves for stopping and starting flow of the gas, a depressurization valve, a filter, and the like.

Figure 4:
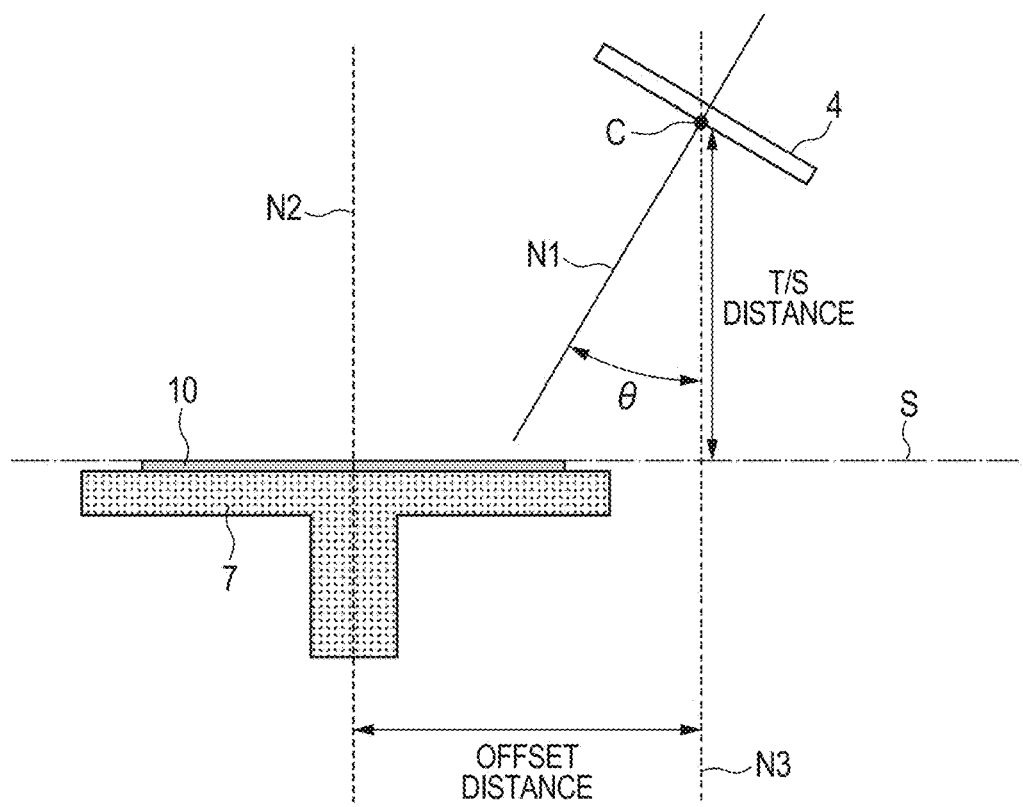
FIG. 4 is a view for explaining a relationship between the positions of a target and a substrate in the sputtering apparatus according to one embodiment of the present invention.

Next, various parameters for explaining a relationship between the positions of the substrate 10 and each of the insulator targets 4 are described by using FIG. 4.

First, an angle θ is described. As illustrated in FIG. 4, the angle θ is an angle between a straight line N1 and a straight line N3.

The straight line N3 is a normal line of a plane including a processed surface of the substrate 10. Alternatively, the straight line N3 may be defined based on the surface of the substrate holder 7 on which the substrate 10 is placed. Specifically, the straight line N3 can be also defined as a normal line of a plane including the surface of the substrate holder 7 on which the substrate 10 is placed.

The straight line N1 is a normal line of the sputtered surface of the insulator target 4 which passes the center c of the sputtered surface of the insulator target 4. Note that, although the shape of the sputtered surface of the insulator target 4 changes by performing film formation processing on the substrate 10, the straight line N1 does not change with the change in the surface shape of the insulator target 4 due to use thereof. In other words, the straight line N1 is defined based on a state where the insulator target 4 is unused and a front face of the sputtered surface is flat. Alternatively, the straight line N1 may be defined based on a surface of the target holder 6 on which the insulator target 4 is placed. Specifically, the straight line N1 can be defined as a normal line of the surface of the target holder 6 on which insulator target 4 is placed, the normal line passing the center c of the sputtered surface of the insulator target 4.

The straight line N2 is a normal line of a film formation surface of the substrate 10 which passes the center of the film formation surface of the substrate 10. Note that, although the shape of the film formation surface of the substrate 10 changes when the substrate 10 is subjected to the film formation processing, the straight line N2 is defined based on a state before the substrate 10 is subjected to the film formation where a front face of the film formation surface is flat. Alternatively, the straight line N2 may be defined based on the surface of the substrate holder 7 on which the substrate 10 is placed. Specifically, the straight line N2 can be defined as a normal line of the surface of the substrate holder 7 on which the substrate 10 is placed, which passes the center of the film formation surface of the substrate 10.

The angle θ is set such that 0° is a state where the straight line N3 and the straight line N1 relating to the insulator target 4 are aligned with each other. Then, an angle between the straight line N3 and the straight line N1 obtained by rotating, from the aforementioned state, the insulator target 4 in an in-plane direction of a plane including the straight line N1 and the straight line N3, about the front face center of the insulator target 4 is defined as θ.

In the film formation apparatus 1 according to the embodiment, the target holder 6 and the substrate holder 7 are arranged such that the center of the insulator target 4 and the center of the substrate 10 are offset from each other. In the embodiment, an angle obtained by rotating the insulator target 4 from the state of e=0° in such a direction that the front face of the insulator target 4 faces the substrate 10 side is indicated by "+", and an angle obtained by rotating the insulator target 4 in the opposite direction is indicated by "−." Accordingly, for example, in 0°<θ<+90°, the straight line N1 which is the center normal line of the insulator target 4 and the straight line N2 which is the center normal line of the substrate 10 intersect each other on a side of the insulator target 4 on which the substrate 10 exists.

Next, an offset distance and a T/S distance are described.

The offset distance is a distance between the straight line N2 passing the center of the substrate 10 and the straight line N3.

The T/S distance is a distance from the center position of the front face of the insulator target 4 to a plane S including the front face of the substrate 10, along the straight line N3. Alternatively, the T/S distance may be defined based on the surface of the target holder 6 on which the insulator target 4 is placed and the surface of the substrate holder 7 on which the substrate 10 is placed.

Note that the angle θ is not limited to a particular angle as long as the angle θ is within a range in which the film formation processing on the substrate 10 is possible. However, the angle θ is preferably 15° e<60° in consideration of the in-plane distribution of the film thickness and adherence efficiency of the sputtered particles onto the substrate 10 in the formation of the insulating film on the substrate 10.

Figure 5:
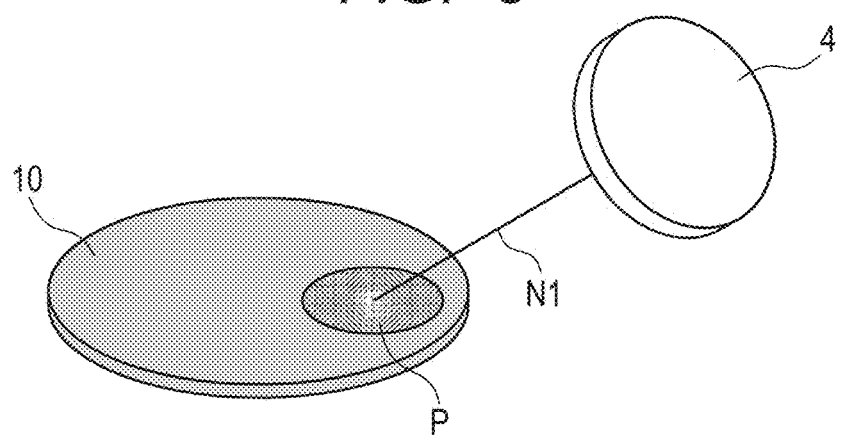
FIG. 5 is a view for explaining a "projection plane of an insulator target on a plane including a front face of the substrate" which is used in explanation of one embodiment of the present invention.

Next, a "projection plane of the insulator target formed on the plane including the front face of the substrate" which is used in the explanation of the embodiment is described by using FIG. 5.

As illustrated in FIG. 5, the projection plane P of the insulator target 4 on the plane including the substrate 10 can be obtained by extending imaginary straight lines from points on the front face of the insulator target 4 in a direction perpendicular to the front face of the insulator target 4, i.e. a direction along the straight line N1 and by considering intersections of the straight lines with the plane including the substrate 10.

Note that, in the film formation apparatus 1 according to the embodiment, the substrate holder 7 is provided with a mechanism capable of moving vertically and horizontally, and the film formation can be executed with the aforementioned offset distance and the T/S distance set respectively to predetermined distances. Moreover, the target holder 6 is provided with a swing mechanism capable of changing the aforementioned angle θ of the insulator target 4 to the substrate 10, and the film formation can be executed with the angle θ set to a predetermined angle.

Next, a "state of the projection plane of the insulator target formed on the plane including the front face of the substrate" which is used in the explanation of the embodiment is described.

The "state of the projection plane of the insulator target formed on the plane including the front face of the substrate" is determined by using the position and the shape of the projection plane of the insulator target formed on the plane including the front face of the substrate. Changing at least one of the aforementioned angle θ, the T/S distance, and the offset distance changes the projection plane P of the insulator target 4 on the plane including the substrate 10. For example, when the angle θ is changed, the shape of the projection plane changes. Moreover, when at least one of the T/S distance and the offset distance is changed, the position of the projection plane of the target formed on the plane including the front face of the substrate changes.

Figure 6:
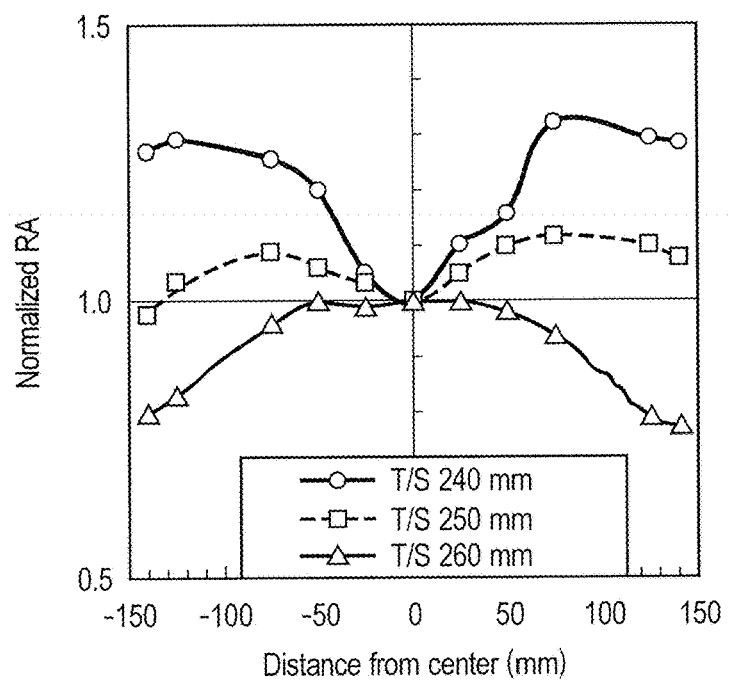
FIG. 6 is a graph depicting RA distribution in a plane of the substrate when an oxide film is formed by a conventional method using RF sputtering.

FIG. 6 depicts an example of relationships among positions on the substrate and a RA (resistance area) when a MgO target is used as the insulator target and a MgO film is formed on the substrate as the insulating film with the T/S distance being varied. Note that the film formation is performed with the angle θ being set to 30° in all cases. The horizontal axis of the graph depicted in FIG. 6 represents positions of points on the substrates which are located on a straight line passing the center of the substrate, and the center of the substrate is set to zero. The vertical axis represents the RA at the position of each of the points on the substrate. The RA is expressed as a normalized value with the value at the center of the substrate being 1.0. The configuration of the films other than MgO is the same as the configuration illustrated in FIG. 2. Measurement of RA is performed in a state where the stacked structure illustrated in FIG. 2 is formed and element separation is not yet performed.

As is apparent from the results illustrated in FIG. 6, for example, when the T/S distance is set to 240 mm, the RA is lowest at the substrate center, increases toward a substrate outer periphery, and then slightly decreases in an outermost periphery. Meanwhile, when the T/S distance is set to 260 mm and the projection plane of the MgO target formed on the plane including the front face of the substrate is changed, the RA is highest near the substrate center and decreases toward the substrate outer periphery. RA distribution (1θ, the same applies hereafter) in each T/S distance is calculated, and results are as follows: 9.2% in the case where the T/S distance is 240 mm, 4.3% in the case of 250 mm, and 9.6% in the case of 260 mm. Regarding edge exclusion, no measurement of RA is performed in a peripheral edge portion having a width of 10 mm from an edge of the substrate (wafer) on which the MgO film is formed, and this portion is excluded from the calculation of RA distribution.

In the embodiment, the insulating film such as an oxide film is formed by a sputtering method while combining two film formation processes to reduce the RA distribution described above.

Specifically, a first film formation process is performed when the relationship between the positions of the substrate holder and the target holder relative to each other is a first relationship or when the projection plane of the insulator target formed on the plane including the front face of the substrate is in a first state. In the first film formation process, the film is formed such that a film with first characteristic variation for a certain characteristic is obtained from a center portion to a peripheral portion of the substrate. In this case, the certain characteristic is, for example, an electrical characteristic such as the RA described above.

Then, a second film formation process is performed when the relationship between the positions of the substrate holder and the target holder relative to each other is a second relationship or when the projection plane of the target formed on the plane including the front face of the substrate is in a second state. In the second film formation process, the film is formed such that a film with second characteristic variation for the same characteristics as the first characteristic variation is obtained at least partly from the center portion to the peripheral portion of the substrate, the second characteristic variation having opposite tendency to the first characteristic variation.

For example, the formation of the MgO film is performed with the T/S distance set to 240 mm in the first film formation process, and the formation of the MgO film is performed with the T/S distance set to 260 mm in the subsequent second film formation process.

By performing steps including the first and second film formation processes as described above, the first characteristic variation in the insulating film deposited in the first film formation process which occurs at least partly from the center portion to the peripheral portion of the substrate is cancelled out by the second characteristic variation in the insulating film deposited in the second film formation process which occurs at least partly from the center portion to the peripheral portion of the substrate. As a result, it is possible to reduce variation in certain characteristic such as the RA in a direction from the center portion toward the peripheral portion of the substrate. Furthermore, performing formation of an oxide film by using an oxide target as the insulator target can achieve a higher MR ratio than that in the case where the oxide film is formed by oxidizing a metal film.

Figure 7:
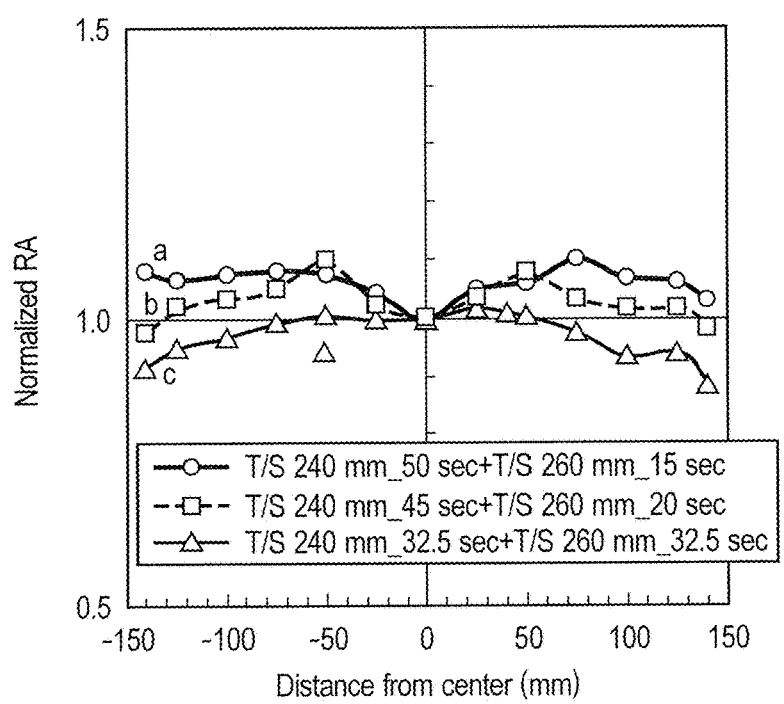
FIG. 7 is a graph depicting RA distribution in the plane of the substrate when an oxide film is formed by using a method according to one embodiment of the present invention.

FIG. 7 illustrates examples of variation in RA among various points in the plane of the substrate when the method in the embodiment is used. The horizontal axis and the vertical axis of the graph depicted in FIG. 7 are the same as those in the graph depicted in FIG. 6. In this experiment, a MgO target is used as the insulator target and a MgO film is formed on the substrate as the insulating film. Total film formation time in the first film formation process and the second film formation process is fixed to 65 seconds. The T/S distance is set to 240 mm in the first film formation process and is set to 260 mm in the second film formation process. Under such conditions, there is studied how the RAs at the various points in the plane of the substrate vary when the processing time of each film formation step is varied.

A plot a in FIG. 7 depicts a result in the case where the film formation is executed for 50 seconds in the first film formation process and is executed for 15 seconds in the second film formation process. The RA distribution in this case is 2.4%. A plot b depicts a result in the case where the film formation is executed for 45 seconds in the first film formation process and is executed for 20 seconds in the second film formation process. The RA distribution in this case is 3.4%. A plot c depicts a result in the case where the film formation is executed for 32.5 seconds in the first film formation process and is executed for 32.5 seconds in the second film formation process. The RA distribution in this case is 4.2%. As is apparent from the results depicted in FIG. 7, when the formation of the MgO film is performed by using the method in the embodiment, the RA distribution is better than all of the results depicted in FIG. 6.

The RA used in the description of the embodiment is explained. The RA means a junction resistance value and is defined as RA=Rp×A ($\Omega \cdot \mu m^2$). In this formula, Rp is a resistance value in a state where magnetization of a fixed layer and magnetization of a free layer are parallel (resistance is low). A is a cross-sectional area (surface perpendicular to a current direction) of an element. In the measurement of RA, there is used a method in which measurement is performed by using a measurement device developed by using a CIPT (Current In-Plane Tunneling) method which is a technique developed by IBM Corporation of the USA and Infineon Technologies AG of Germany and a technique of microscopic 12 point probe by CAPRES A/S. The measurement can be performed with a TMR element formed by processing a tunnel magnetoresistive film being used as a target of the measurement. Alternatively, it is possible to use RA values measured with a CIPT measuring device which can perform simpler measurement. In the embodiment, the RA values measured with the CIPT measuring device are used.

The CIPT method is a method in which the resistance of a TMR film in a direction perpendicular to a film surface is measured and a resistance value is measured by bringing four probes into contact with a front face of a magnetoresistive effect film. A case where the TMR film (TMR element) shown in FIG. 1 is the measurement target is described as an example. The resistance of the TMR film measured by the CIPT method is a combined resistance of a resistance Rt of an upper portion of the MgO layer which is the tunnel barrier layer in the horizontal direction, a resistance Rb of a lower portion of the MgO layer in the horizontal direction, and a resistance RA in a direction perpendicular to the MgO layer. Using metal layers with low electrical resistances as the electrodes in upper and lower portions of the TMR film can reduce the resistances of the upper and lower portions of the MgO layer in the horizontal direction and improve the measurement accuracy of the resistance RA in the perpendicular direction in the combined resistance. The RA which is the junction resistance value can be measured by using the CIPT method as described above.

Note that, in the above description, the case where the first film formation process and the second film formation process are performed by using one insulator target is described. However, each film formation step can be executed by using multiple insulator targets made of the same insulator material. Performing the film formation by simultaneously sputtering multiple insulator targets can increase the film formation speed and improve the productivity.

Moreover, in the above description, the case where the first film formation process and the second film formation process are performed by using the same insulator target is described. Specifically, the first film formation process is performed by sputtering a certain insulator target. Thereafter, the substrate holder is driven to change the T/S distance, and then the second film formation process is performed by sputtering the same insulator target again. However, the first film formation process and the second film formation process can be simultaneously performed by simultaneously sputtering different insulator targets, which are separate but are made of the same insulator material, respectively as an insulator target used in the first film formation process and an insulator target used in the second film formation process. The T/S distances are assumed to different between these different insulator targets. This method can be executed by using a sputtering apparatus which is provided with multiple target holders for one substrate holder and in which a distance from the target holder to the substrate holder varies between the target holders. Since the step of changing the T/S distance becomes unnecessary by employing such a method, it is possible to reduce substrate processing time and improve the productivity.

In the embodiment described above, the T/S distance is changed to change the state of the projection plane of the insulator target formed on the plane including the processed surface of the substrate. However, the method of changing the state of the projection plane of the insulator target is not limited to this method. For example, an inclination angle θ (see FIG. 4) of the insulator target used in the first film formation process to the substrate and an inclination angle θ of the insulator target used in the second film formation process to the substrate can be set differently to change the projection plane of the insulator target formed on the plane including the processed surface of the substrate.

The tendency of the characteristic variation for the certain characteristic which occurs from the center portion to the peripheral portion of the substrate can be changed also in the case where the inclination angle θ of the insulator target to the substrate is changed, as in the case where the T/S distance is changed. For example, in the first film formation process, the formation of the insulating film such as an oxide layer is performed by sputtering a first insulator target at θ=θ1. Next, in the second film formation process, the formation of the insulating film such as an oxide layer is performed by sputtering a second insulator target at θ=θ2 (where θ1≠θ2). In this case, the second film formation process is performed to provide the insulating film having a second characteristic variation having opposite tendency to the first characteristic variation in the insulating film formed in the first film formation process for a certain characteristic, the first characteristic variation occurring from a center portion to a peripheral portion of the substrate, the second characteristic variation occurring at least partly from the center portion to the peripheral portion of the substrate.

Note that various methods can be employed as a method of changing the inclination angle θ of the insulator target to the substrate. For example, it is possible to provide a swing mechanism capable of changing the angle θ of the target to the substrate in the target holder and execute the film formation by using the same insulator target such that, after the execution of the first film formation process, the angle θ is changed and the second film formation process executed. Alternatively, it is possible to execute the first film formation process by using an insulator target preset at the angle θ 1 and then execute the second film formation process by using another insulator target preset at the angle θ 2. As another alternative, the first film formation process and the second film formation process may be executed simultaneously by performing the film formation processes simultaneously by using both of the insulator target preset at the angle θ 1 and the other insulator target preset at the angle θ 2.

Moreover, as described above, the projection plane of the target formed on the plane including the processed surface of the substrate can be changed by changing the offset distance (see FIG. 4) in addition to or instead of changing the T/S distance and the angle θ as described above.

Figure 8:
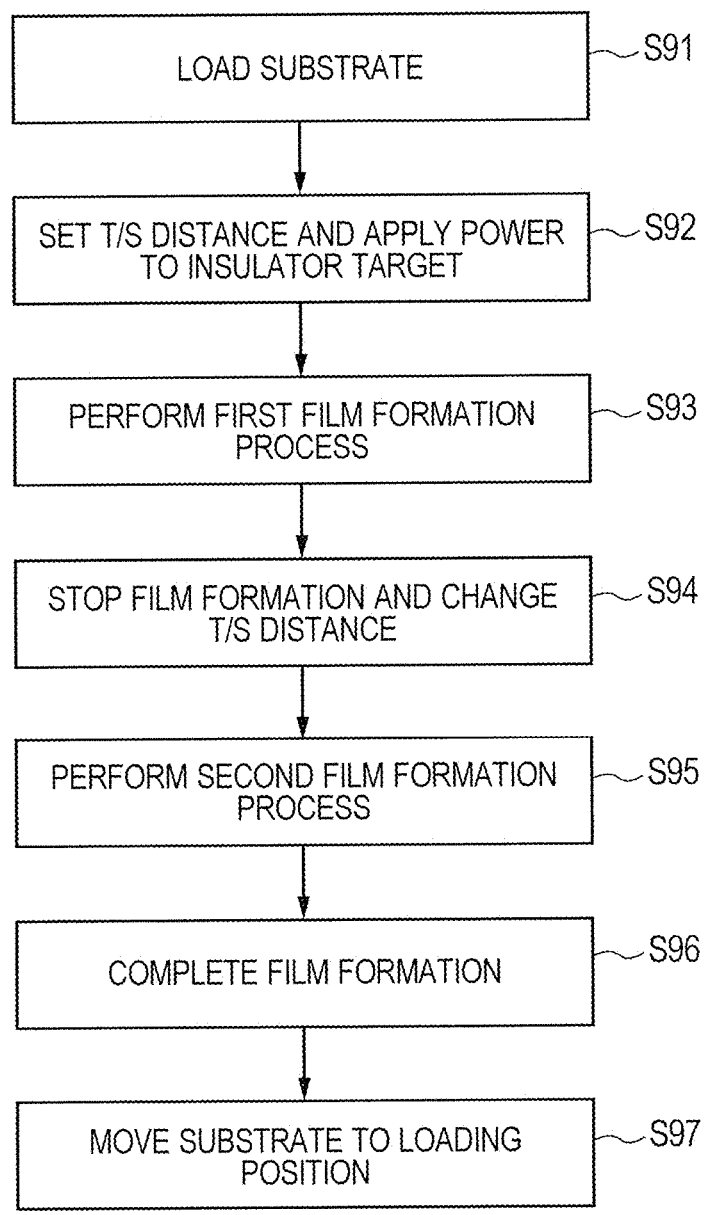
FIG. 8 is a flowchart for explaining RF sputtering according to one embodiment of the present invention.
Figure 9:
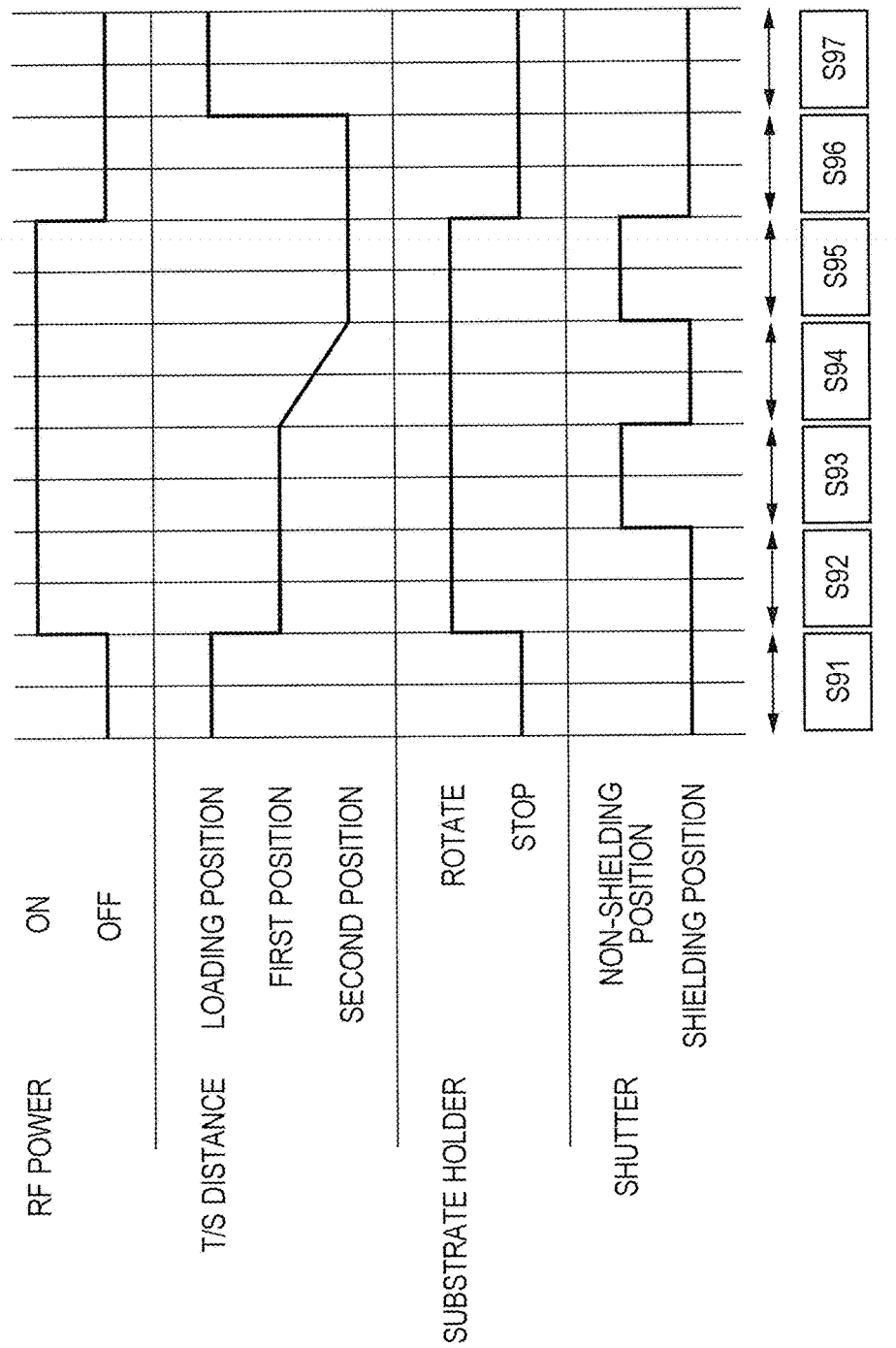
FIG. 9 is a timing chart for explaining the RF sputtering according to one embodiment of the present invention.

Operations of the elements of the apparatus in each of steps of the aforementioned embodiment are described by using FIGS. 8 and 9. FIG. 8 is a flowchart depicting RF sputtering processing in the aforementioned embodiment. Moreover, FIG. 9 is a timing chart depicting states of "RF power," "T/S distance," "rotation of substrate holder," and "position of shutter" at each of time points at which the steps of the flowchart described in FIG. 8 are executed.

In step S91, the substrate 10 is loaded into the vacuum chamber 2 through a gate valve 42 which is a substrate loading port, and is held on the substrate holder 7. In this case, the substrate holder 7 is located at a "loading position" to receive the substrate from not-illustrated substrate holding means.

Note that, at a predetermined timing before the start of the electric discharge, gas inside the vacuum chamber 2 is exhausted by the turbomolecular pump 48 and the dry pump 49 such that the inside of vacuum chamber 2 is set to a predetermined pressure, and the gas for electrical discharge is introduced into the vacuum chamber 2 by the gas introduction mechanism 15.

In step S92, the substrate holder drive mechanism 31 is activated to vertically move the substrate holder 7 such that the relationship between the positions of the substrate holder 7 and the target holder 6 relative to each other is set to the first relationship. The T/S distance is thus set to a predetermined distance. In FIG. 9, the position of the substrate holder 7 in this case is described as "first position." Note that the loading position and the first position may be the same. Moreover, the angle θ may be set to a predetermined angle by the swing mechanism of the target holder 6 in addition to or instead of the vertical moving of the substrate holder 7.

Subsequently, in step S92, the substrate holder drive mechanism 31 rotates the substrate holder 7, and the RF power supply 12 applies the RF power to the insulator target 4 to perform the electrical discharge. In this case, the shutter 13 disposed near the insulator target 4 is located between the insulator target 4 and the substrate 10 (shielding position). The insulator target 4 is shielded by the shutter 13 at the start of the electrical discharge as described above because the sputtering rate is unstable at the start of the electrical discharge.

After the sputtering rate becomes stable, in step S93, the shutter 13 is moved to such a position that the shutter 13 is not located between the insulator target 4 and the substrate 10 (non-shielding position), and the substrate 10 is subjected to RF sputtering in the first film formation process. An insulating film such as a MgO film is thereby formed.

Next in step S94, the shutter 13 is moved to the shielding position to temporarily stop the film formation. Then the substrate holder drive mechanism 31 is activated to vertically move the substrate holder 7 such that the relationship between the positions of the substrate holder 7 and the target holder 6 relative to each other is set to the second relationship. The T/S distance set in step S92 is thereby changed. In FIG. 9, the position of the substrate holder 7 in this case is described as "second position." Note that, in this case, the angle θ may be changed from the angle set in step S92 by the swing mechanism of the target holder 6 in addition to or instead of the vertical moving of the substrate holder 7.

Next in step S95, the shutter 13 is moved to the non-shielding position again, and the substrate 10 is subjected to RF sputtering in the second film formation process. An insulating film such as a MgO film is thereby formed.

Next in step S96, the application of the RF power by the RF power supply 12 is stopped and the shutter 13 is moved to the shielding position to complete the film formation. Note that there is no need to perform the stop of the application of RF power and the moving of the shutter 13 to the shielding position simultaneously.

Next in step S97, the substrate holder drive mechanism 31 moves the substrate holder 7 to the loading position to move the substrate 10 to the loading position. Then, the substrate 10 is unloaded from the vacuum chamber 2 and the RF sputtering processing is completed.

Note that FIG. 9 depicts the case where the RF power is continuously applied from steps S92 to S95, i.e. during the first film formation process, the changing of the T/S distance, and the second film formation process. However, the application of RF power is not limited to this way. For example, the application of RF power may be stopped in transition from one step to another in steps S92 to S95. However, the continuous application of RF power from steps S92 to S95 is preferable from a view point of improvement in throughput, because waiting time from the start of the application of RF power to the stabilization of the sputtering rate can be omitted.

Figure 10:
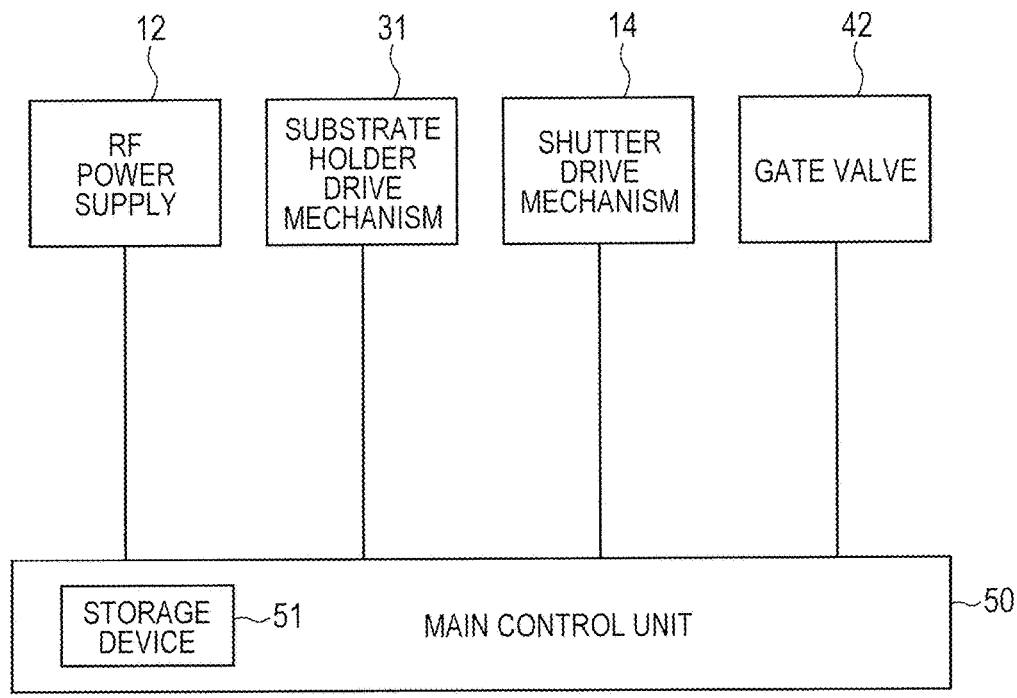
FIG. 10 is a diagram for explaining a control apparatus used in a sputtering apparatus according to one embodiment of the present invention.

A control apparatus for operating the sputtering apparatus in the embodiment is described by using FIG. 10. FIG. 10 depicts the control apparatus used for the sputtering apparatus in the embodiment.

As illustrated in FIG. 10, the control apparatus has a main control unit 50 including a storage device 51. A control program for executing various processes of the substrate processing in the embodiment is stored in the storage device 51 included in the main control unit 50. For example, the control program is implemented as a mask ROM. Alternatively, the control program can be installed into the storage device 51 formed of a hard disk drive (HDD) or the like, via an external storage medium or a network. The main control unit 50 is electrically connected to the RF power supply 12 for applying the high-frequency power to the target, the substrate holder drive mechanism 31, the shutter drive mechanism 14, the gate valve 42, and the like. The main control unit 50 of the control apparatus is thereby configured to be capable of managing and controlling the operations of the sputtering apparatus 1.

The storage device 51 may further hold data for executing the first film formation process and the second film formation process. For example, the storage device 51 holds, for each of the angle θ, the T/S distance, and the offset distance, a condition for obtaining a film in which the junction resistance value decreases at least partly from the center portion to the peripheral portion of the substrate and a condition for obtaining a film in which the junction resistance value increases at least partly from the center portion to the peripheral portion of the substrate. Then the storage device 51 stores these conditions in advance as conditions to be used in the first film formation process and the second film formation process.

(Description of MRAM)

Figure 11:
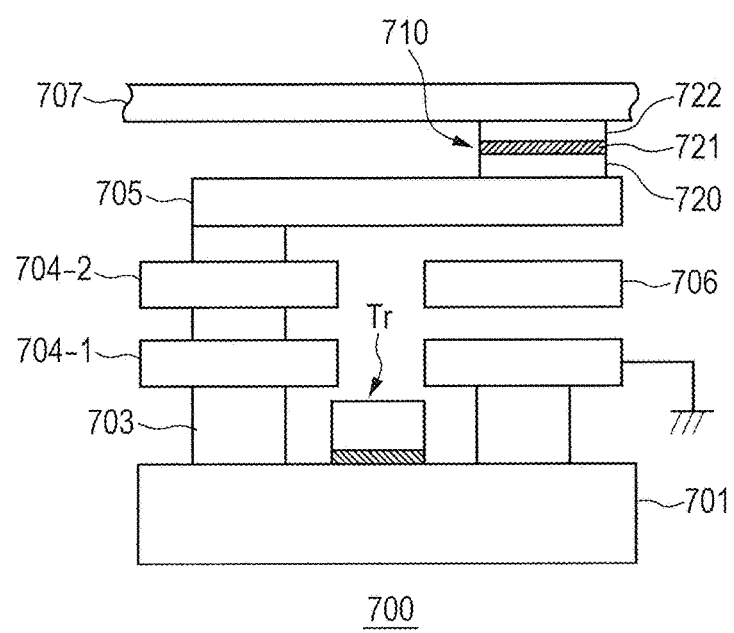
FIG. 11 is a view illustrating a schematic structure of a magnetoresistive memory to which a tunnel magnetoresistive effect element manufactured by using a method of manufacturing a tunnel magnetoresistive effect element in one embodiment of the present invention can be applied.

Next description is given of an MRAM using a TMR element manufactured by using the aforementioned method for manufacturing a TMR element. FIG. 11 is a cross-sectional view illustrating a schematic structure of an MRAM 700.

A thin-film transistor Tr is formed on a substrate 701 of the MRAM 700. A source/drain diffusion layer of the thin-film transistor Tr is electrically connected to a TMR element 710 via a contact plug 703, an interconnection 704-1, an interconnection 704-2, and a bottom electrode layer 705.

The TMR element 710 has a fixed magnetization layer 720 formed on the bottom electrode layer 705, a tunnel barrier layer 721 formed on the fixed magnetization layer 720, and a free magnetization layer 722 formed on the tunnel barrier layer 721.

Moreover, a word line 706 is disposed below the TMR element 710 to be located away from and below the bottom electrode layer 705. The word line 706 is formed in a band shape extending in a direction perpendicular to the surface of the sheet. Moreover, a bit line 707 having a band shape extending in a direction orthogonal to the word line 706 is disposed on the TMR element 710. In other words, the TMR element 710 is disposed between the word line 706 and the bit line 707 which are arranged orthogonal to each other.

The TMR element 710 is formed by stacking the fixed magnetization layer 720, the tunnel barrier layer 721, and the free magnetization layer 722 on the bottom electrode layer 705 and performing pattering by etching the fixed magnetization layer 720, the tunnel barrier layer 721, and the free magnetization layer 722.

Using the TMR element 710 manufactured by using the method in the embodiment can improve reproducibility of a magnetoresistive effect and in-plane uniformity in a wafer and thereby improve a yield which is productivity of the MRAM.

The invention claimed is:

1. A sputtering apparatus comprising:
a processing chamber;
an exhaust unit which exhausts gas inside the processing chamber;
a substrate holder which is disposed inside the processing chamber and which holds a substrate;
a target holder which is disposed inside the processing chamber and to which an insulator target is attachable;
a high-frequency power supply which applies high-frequency power to the target holder to form plasma near the target holder; and
a control unit which performs a first film formation process on the substrate held by the substrate holder by setting a relationship between relative positions of the target holder and the substrate holder to a first relationship and sputtering the insulator target attached to the target holder by causing the high-frequency power supply to apply the high-frequency power to the target holder; and then performs a second film formation process on the substrate by setting the relationship between the relative positions of the target holder and the substrate holder to a second relationship different from the first relationship and sputtering the insulator target attached to the target holder by causing the high-frequency power supply to apply the high-frequency power to the target holder, the second relationship providing an insulating film having a second characteristic variation having opposite tendency to a first characteristic variation in the insulating film provided by the first film formation process using the first relationship, the first characteristic variation occurring from a center portion to a peripheral portion of the substrate, the second characteristic variation occurring at least partly from the center portion to the peripheral portion,
wherein the insulating films formed in the first film formation process and the second film formation process constitute a tunnel barrier layer of a tunnel magnetoresistive effect element,
wherein the first characteristic variation and the second characteristic variation are variation in junction resistance value of the tunnel barrier layer,
wherein the first characteristic variation is variation in which the junction resistance value in the center portion of the substrate is higher than the junction resistance value in the peripheral portion of the substrate, and
wherein the second characteristic variation is variation in which the junction resistance value in the center portion of the substrate is lower than the junction resistance value in the peripheral portion of the substrate.

* * * * *